(12) United States Patent
Druist et al.

(10) Patent No.: US 8,956,201 B2
(45) Date of Patent: Feb. 17, 2015

(54) CORRECTING CURRENT CROWDING IN ROW BAR AND VIAS FOR SINGLE PAD BONDING

(71) Applicant: HGST Netherlands B.V., Amsterdam (NL)

(72) Inventors: David P. Druist, Santa Clara, CA (US); Glenn P. Gee, San Jose, CA (US); Edward H. Lee, San Jose, CA (US); David J. Seagle, Morgan Hill, CA (US); Darrick T. Smith, San Jose, CA (US)

(73) Assignee: HGST Netherlands, B.V., Amsterdam (NL)

( * ) Notice: Subject to any disclaimer, the term of this patent is extended or adjusted under 35 U.S.C. 154(b) by 264 days.

(21) Appl. No.: 13/690,694

(22) Filed: Nov. 30, 2012

(65) Prior Publication Data

US 2014/0154953 A1 Jun. 5, 2014

(51) Int. Cl.
*B24B 49/10* (2006.01)
*B24B 37/013* (2012.01)
*B24B 37/005* (2012.01)
*B24B 7/22* (2006.01)
*H01L 23/00* (2006.01)
*G11B 5/00* (2006.01)

(52) U.S. Cl.
CPC .............. *B24B 37/005* (2013.01); *B24B 7/228* (2013.01); *H01L 24/05* (2013.01); *H01L 24/06* (2013.01); *G11B 5/00* (2013.01); *H01L 2224/48463* (2013.01); *H01L 2224/49107* (2013.01); *H01L 2924/3025* (2013.01)
USPC .................................................. 451/5; 451/1

(58) Field of Classification Search
USPC ........ 451/5, 8, 9, 10, 28, 1; 29/603.09, 603.1, 29/603.12, 603.16
See application file for complete search history.

(56) References Cited

U.S. PATENT DOCUMENTS

| | | | |
|---|---|---|---|
| 5,175,938 A | 1/1993 | Smith | |
| 5,816,890 A * | 10/1998 | Hao et al. | 451/5 |
| 6,047,224 A | 4/2000 | Stover et al. | |
| 6,132,290 A | 10/2000 | Sugiyama et al. | |
| 6,370,763 B1 | 4/2002 | Watanuki et al. | |
| 6,532,646 B2 | 3/2003 | Watanuki | |
| 6,684,171 B2 * | 1/2004 | Church et al. | 702/104 |
| 7,147,539 B1 | 12/2006 | Hao et al. | |
| 7,551,406 B1 * | 6/2009 | Thomas et al. | 360/317 |
| 8,165,709 B1 * | 4/2012 | Rudy | 700/121 |

* cited by examiner

*Primary Examiner* — Robert Rose
(74) *Attorney, Agent, or Firm* — Patterson & Sheridan, LLP

(57) ABSTRACT

Embodiments described herein generally relate to connecting electronic lapping guides (ELGs) to a lapping controller to prevent the effects of current crowding while reducing connections to the ELGs in single pad lapping. Devices and systems can include a row of sliders including a magnetoresistive (MR) element, a plurality of high resistance ELGs connected to both the wafer and to at least one bonding pad and at least two peripheral grounding vias connected to the wafer. Methods and systems include a wafer comprising a plurality of sliders wherein each slider is connected to a lapping controller and the delivery of current to the ELGs is sequential to groups of sliders such that only one group of ELGs is being measured at any time.

22 Claims, 6 Drawing Sheets

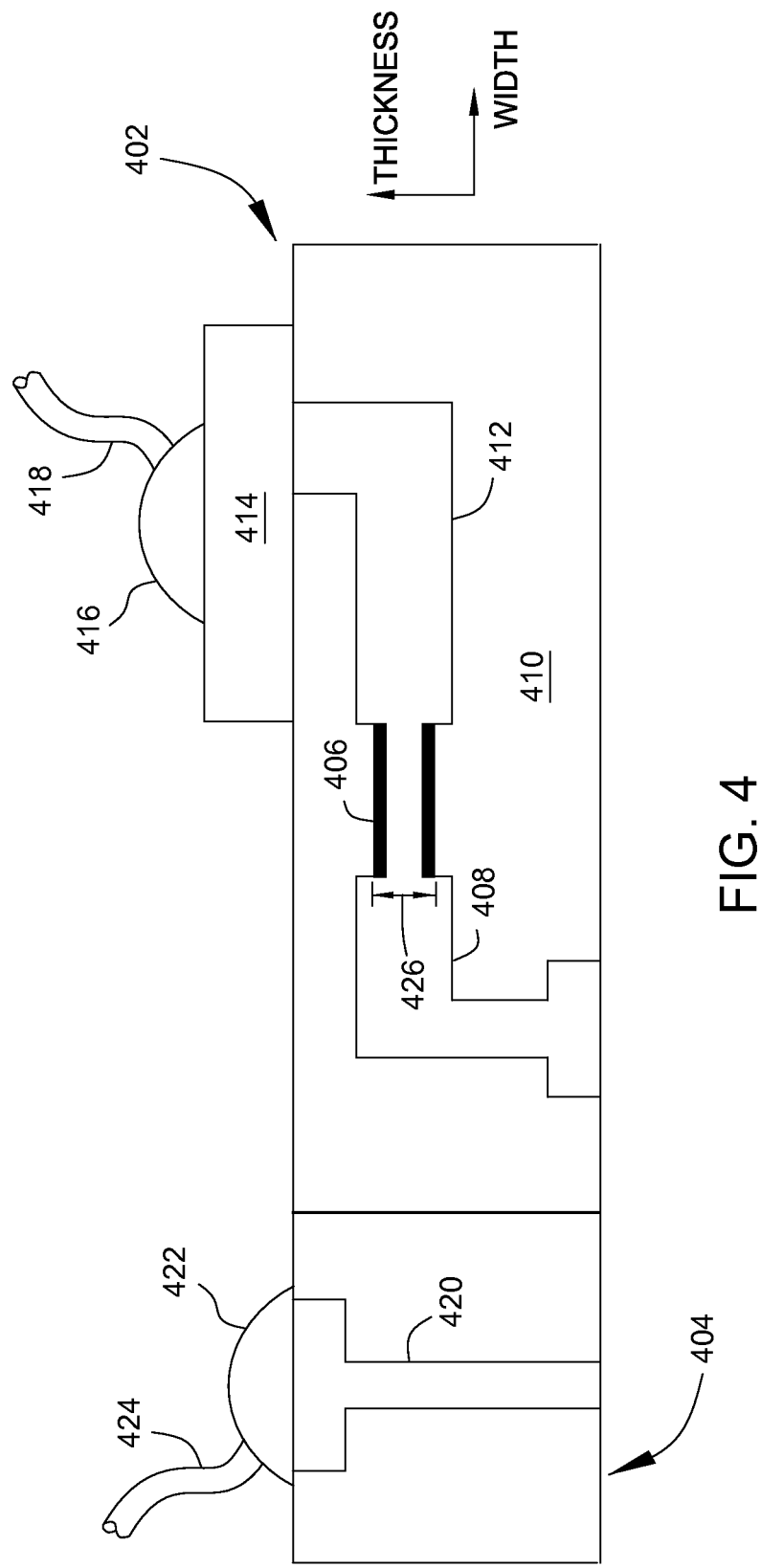

CORRECTING CURRENT CROWDING IN ROW BAR AND VIAS FOR SINGLE PAD BONDING

BACKGROUND OF THE INVENTION

1. Field of the Invention

Embodiments of the present invention generally relate to methods and apparatus for minimizing the effective wafer resistance of an electronic lapping guide.

2. Description of the Related Art

Disc drives are well known in the art and comprise several discs, each disc having several concentric data tracks for storing data. A magnetic read/write transducing head carried by a slider is used to read from or write to a data track on a disc. Such sliders, as well as the transducing heads, are typically produced by using thin film deposition techniques. In a typical process, an array of sliders are formed on a common substrate, such as a wafer. The wafer is typically inspected, and is then sliced to produce rows, with a row of sliders in a side-by-side pattern on each row. The rows are then lapped at the surface that will eventually face the recording medium to obtain the desired magnetoresistive (MR) element height (also referred to as the specified stripe height). After lapping, an air bearing pattern is formed on the rows and the rows are diced to produce individual sliders.

With the move to higher areal densities on discs, there is pressure to reduce the stripe height on the sliders. Reducing the stripe height permits an increase in areal densities and signal quality. However, problems emerge as stripe heights decrease. As stripe heights are reduced, seemingly minor variances in the stripe heights from slider to slider will produce different signal amplitudes in each of the sliders. These differing amplitudes make it difficult to control the signal from slider to slider. Thus, though it is desired to reduce the stripe heights, it is also desired that the MR elements for each slider on the row be lapped to the same stripe height.

To achieve reduced stripe heights on the sliders, accurate control of the manufacturing process has become critical. Current designs for controlling the lapping process involve placing one or more electronic lapping guides (ELG) on the row. During the lapping process, material is removed from the surface of the row. As material is removed from the surface of the row, material is likewise removed from the ELGs attached to the row.

The ELG is connected to a lapping controller which provides a current to the ELG and determines the stripe height of the ELG based on resistance between the bonding pad and the grounding pad. The ELGs have a known resistance as a function of height so that as the surface of the row is lapped, the resistance of the lapping sensor changes. The ELGs are monitored during lapping to provide feedback to a control system indicating the amount of material being removed from the row by the lapping device.

The ELG is connected to a lapping controller by either a 2 wire (double pad) connection or a 1 wire (single pad) connection. Though a single pad connection ELG allows for fewer connections to the wafer and more space conservation, precision decreases compared to lapping of a double pad connection ELG. When lapping multiple sliders of a row using single pad lapping, the resistance detected at one ELG may not properly correlate to the resistance detected at the next ELG. This change in resistance can adversely affect proper lapping from one slider to the next.

Thus there is a need for better control of resistance and the effects of that resistance as detected at the ELG during single pad connection lapping of a slider.

SUMMARY OF THE INVENTION

Embodiments of the present invention generally relate to methods and apparatus for minimizing effective wafer resistance during single pad lapping of multiple sliders. By controlling variables related to the effective wafer resistance in single pad lapping, such as current density, or the results of the effective resistance on grounding, such as using resistance-accommodating programs or altering the resistance of the ELG, the precision of double pad lapping can be achieved in single pad lapping without the added cost of connections or wiring required by double pad lapping. In one embodiment, a device, can include a row of sliders, each slider including a magnetoresistive (MR) element deposited at an air bearing surface (ABS) of the slider; an electronic lapping guide (ELG) positioned at the ABS and electrically connected to a wafer, the ELG comprising a resistance and the wafer comprising an effective wafer resistance, wherein the resistance of the ELG is at least 50 times greater than the effective wafer resistance; and a bonding pad electrically connected to the ELG; end regions formed at one or more ends of the row; and at least two peripheral grounding vias, the vias formed in the end regions and comprising a conductive material formed therein.

In another embodiment, a method can include positioning a wafer in a lapping system with a lapping controller, the wafer having a plurality of sliders; a magnetoresistive (MR) element deposited at an air bearing surface (ABS) of each slider; one or more electronic lapping guides (ELGs) positioned at the ABS and electrically connected to the wafer, wherein the ELGs correspond to at least one of the plurality of sliders; a bonding pad electrically connected to each ELG; and one or more peripheral grounding vias electrically connected to the wafer; connecting the lapping controller with the wafer at the bonding pad and the peripheral grounding vias; delivering a current to at least one of the ELGs through the bonding pad, wherein no more than 20% of the ELGs in the wafer receive a current at one time, and wherein the bonding pads and the peripheral grounding vias are electrically connected through the wafer; detecting a resistance at the ELGs which receive a current; adjusting lapping based on the resistance detected at the ELGs which receive a current, wherein the lapping is adjusted based on the resistance of the corresponding ELGs; lapping the ELGs based on the resistance detected to achieve a specific stripe height; and repeating the steps of delivering the current and detecting the resistance until each of the ELGs is lapped to a specific stripe height.

In another embodiment, a system for lapping a wafer can include a wafer. The wafer can include a plurality of sliders, each slider having a magnetoresistive (MR) element deposited at an air bearing surface (ABS) of the slider; an electronic lapping guide (ELG) positioned at the ABS and electrically connected to the wafer; and a bonding pad electrically connected to the ELG, wherein the wafer has one or more peripheral grounding vias formed therein. The system can include a lapping system comprising a lapping controller and configured to simultaneously lap an air bearing surface on the plurality of sliders, wherein the wafer is mounted on the lapping system; and the lapping controller electrically coupled to the bonding pads and the peripheral grounding vias, the lapping controller configured to sequentially provide a current to the ELGs in groups of no more than 20% of the attached ELGs, measure the resistance of the ELGs using the current path, and provide instructions to the lapping system based on the measured resistance, wherein the lapping controller is also configured to provide current, measure resistance and provide instructions to the lapping system until each slider is lapped by the lapping system to a desired stripe height.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 depicts a slider with a more resistive electronic lapping guide according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
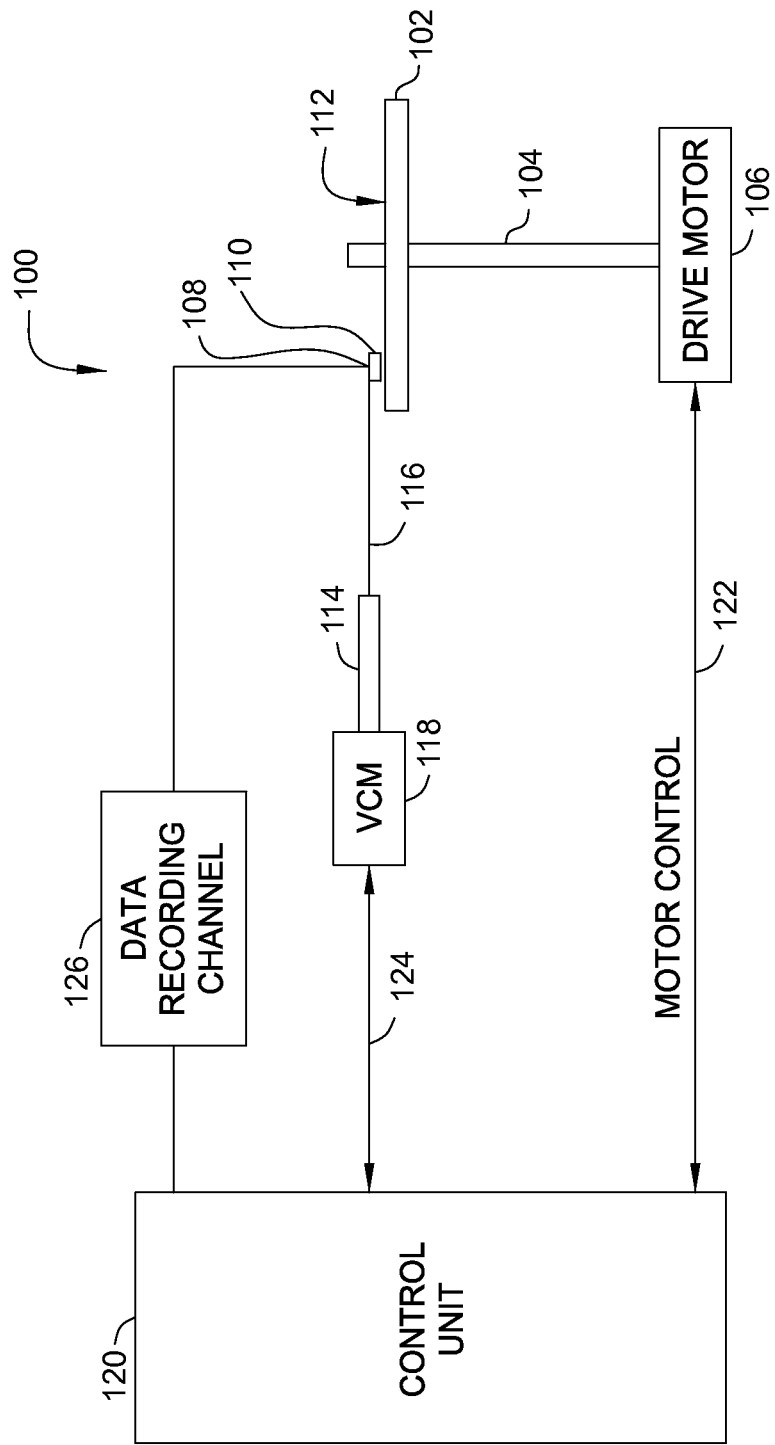
FIG. 1 illustrates a disk drive useable one or more embodiments.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Embodiments described herein generally relate to correcting effective Alumina($Al_2O_3$)-Titanium Carbide (AlTiC) resistance during measurement of ELGs in multi-channel measurement. When lapping the ABS of a slider or row of sliders, the electrical resistance of the ELG is used to adjust the lapping process and set the stripe height for a MR element on the slider. Specifically, as an exterior surface of the ELG at the ABS is lapped, the resistance of the ELG increases. Once the resistance corresponds to the desired stripe height (i.e., the distance between the ABS and the back edge of the sensor) the lapping process is stopped. To measure the electrical resistance of the ELG, a lapping controller is wire bonded to at least one pad that electrically connects the controller to the ELG. In addition to being connected to the bonding pad, the ELG is electrically connected to either a grounding pad or the wafer. The wafer may be used as a common ground for the current that flows through the bond pad and the ELG.

The ELG can be positioned in the kerf region between respective sliders in a row for rough lapping as well as in the slider itself, where the ELG functions during fine lapping. The rough lap process is performed to remove large amounts of material in comparison to the fine lap but results in a relatively rough surface. The fine lap process functions to smooth the surface after the rough lap without significant removal of surface layers and to accurately set final stripe height. In both steps, the ELG allows the lapping controller to measure the amount removed from the surface of the wafer during each lapping pass.

Because many head fabrication techniques lap a plurality of sliders simultaneously, each ELG in the sliders may be electrically coupled to the wafer. The lapping controller is then wire bonded to the individual ELGs via respective pads, but the controller is connected to the wafer only at a few locations. For example, the lapping controller may be wire bonded to thirty ELGs in a row of heads but only have one or two electrical connections to the conductive wafer.

This design reduces the number of grounding connections formed with the ELG and can cut up to half of the expensive bonding required to measure the ELGs. The drawback is that the resistance of the ELG must be inferred by subtracting out the effective resistance of the row bar. Inaccuracy in the accounting for this resistance adds to the inaccuracy of the final ELG stripe height. By sourcing current to multiple ELGs simultaneously, faster dynamic control of lapping can be achieved but the effective bar resistance can becomes less precise due to a phenomena called current crowding. Current crowding occurs from current that accumulates in the wafer from the current flow from the lapping controller to the ELG. When currents are simultaneously sourced to multiple ELGs, they accumulate along the row as they independently seek the grounding pads. The voltage drop along the row is greater than would be expected from a single current and effectively amplifies the common ground resistance. The accumulated current amplifies the error in inferred resistance at the ELG. The current crowding is cumulative with the inherent resistance of the wafer and combines with other factors to create the effective wafer resistance.

Current stripe height sensitivity is about 1 nm/Ohm at a 300 Ohm final ELG target stripe height. Stripe height sigma (also known as stripe height variation) is about 3 nm. The effective wafer resistance may increase this error rate by some measurable amount, such as 1 nm. If the desired end stripe height is approximately 30 nm, a 1 nm increase in error is unacceptable. Therefore, for single bond lapping to maintain the accuracy of double bond lapping, a 10× reduction in the error associated with this effect is desired. The invention described in more detail below accomplishes this goal by compensating for, diminishing the effect of or preventing the occurrence of effective wafer resistance in single pad lapping.

FIG. 1 illustrates a disk drive embodying this invention. As shown, at least one rotatable magnetic disk 102 is supported on a spindle 104 and rotated by a disk drive motor 106. The magnetic recording on each disk is in the form of annular patterns of concentric data tracks (not shown) on the magnetic disk 102.

At least one slider 108 is positioned near the magnetic disk 102, each slider 108 supporting one or more MR elements 110. As the magnetic disk rotates, the slider 108 moves radially in and out over the disk surface 112 so that the MR elements 110 may access different tracks of the magnetic disk 102 where desired data is written. Each slider 108 is attached to an actuator arm 114 by way of a suspension 116. The suspension 116 provides a slight spring force which biases the slider 108 against the disk surface 112. Each actuator arm 114 is attached to an actuator means 118. The actuator means 118 as shown in FIG. 1 may be a voice coil motor (VCM). The VCM comprises a coil movable within a fixed magnetic field, the direction and speed of the coil movements being controlled by the motor current signals supplied by control unit 120.

During operation, the rotation of the magnetic disk 102 generates an air bearing between the slider 108 and the disk surface 112 which exerts an upward force or lift on the slider 108. The air bearing thus counter-balances the slight spring force of suspension 116 and supports slider 108 off and slightly above the magnetic disk 102 surface by a small, substantially constant spacing during normal operation.

The various components of the disk drive 100 are controlled in operation by control signals generated by control unit 120, such as access control signals and internal clock signals. Typically, the control unit 120 comprises logic control circuits, storage means and a microprocessor. The control unit 120 generates control signals to control various system operations such as drive motor control signals on line 122 and head position and seek control signals on line 124. The control signals on line 124 provide the desired current profiles to optimally move and position slider 108 to the desired data track on magnetic disk 102. Write and read signals are communicated to and from write and read heads on the MR element 110 by way of recording channel 126.

The above description of a typical magnetic disk storage system and the accompanying illustration of FIG. 1 are for representation purposes only. It should be apparent that disk storage systems may contain a large number of disks and actuators, and each actuator may support a number of sliders.

Figure 2A:
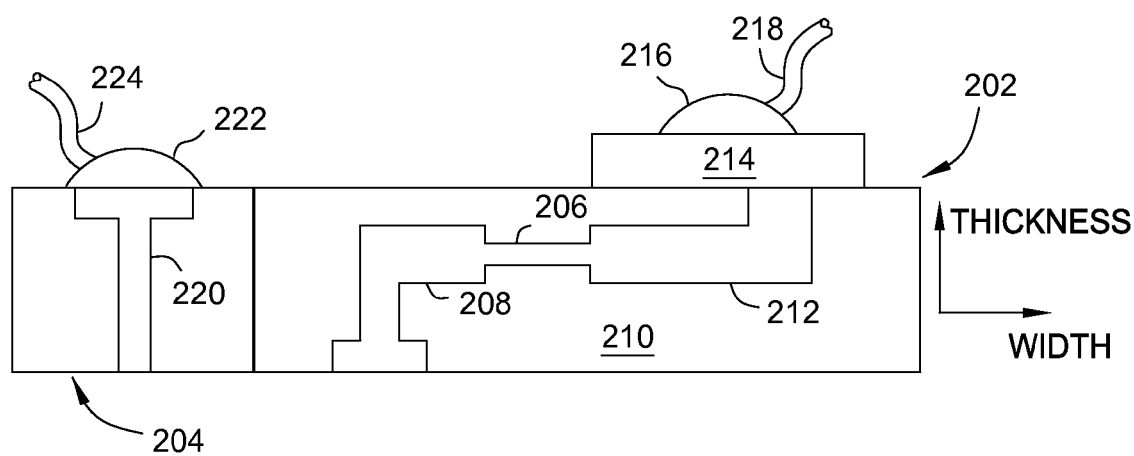
FIG. 2A is a cross-sectional view of a portion of a row according to one embodiment.

FIG. 2A is a cross-sectional view of a portion of a row according to one embodiment. A slider 202 and a row end 204 are depicted here. The proportions of the slider are greatly exaggerated so as to better visualize specific elements of the slider. The slider 202 includes an ELG 206 positioned proximate the air bearing surface. A first side of the ELG 206 is electrically connected to the wafer 210 through a first internal lead 208. The first internal lead 208 can be composed of a conductive material, such as copper, ruthenium or nickel-iron. The wafer can be composed of a conductive material suitable for making sliders, such as Alumina-Titanium Carbide (AlTiC). A second internal lead 212 electrically connects a second side of the ELG 206 to a bonding pad 214. The row end 204 may further comprise a peripheral grounding via 220. The peripheral grounding via 220 can be filled with a highly conductive metal, such as gold or nickel, so as to provide a low resistance electrical connection.

A lapping controller (not shown) is electrically coupled to the ELG 206 by connecting a conductive wire 218 (e.g., gold or copper wire, or other highly conductive material) to a bonding pad 214. The connective material 216 (e.g., a melted portion of a bond wire, a solder bump, conductive paste/epoxy, ultrasonic bonding, and the like) may be used to physically and electrically couple the conductive wire 218 to the bonding pad 214. Like the bonding pad 214, the peripheral grounding via 220 may also be connected to the lapping controller using connective material 222 and a conductive wire 224. In this manner, the lapping controller may use a current source to provide a potential difference between the peripheral grounding via 220 and the bonding pad 214 which generates a current through the ELG 206. In this embodiment, the wafer 210 acts as an electrical connection between the bonding pad 214 and the peripheral grounding via 220.

During the lapping process, the surface of the ELG 206 on the ABS 228 (FIG. 2B) is lapped or polished by an abrasive surface which decreases the physical dimensions of the ELG 206. As a physical dimension of the ELG 206, such as the height, is decreased by the lapping process, the resistance of the ELG 206 is increased, thus the voltage necessary to maintain the same current is changed. Decreasing the size of the ELG 206 reduces the amount of area in which the current can flow, thereby increasing the electrical resistance. The lapping controller measures the resistance based on an established current flowing through the ELG 206 and determines a corresponding stripe height 226 based on the resistance inferred from voltage required to maintain that current. Lapping is stopped once the desired stripe height 226 is achieved, as measured at the ELG 206. The lapping controller may be preconfigured to contain a data structure that correlates a measured resistance to the physical dimensions of the ELG 206. Although the embodiments presented herein discuss lapping as the chosen method for forming the ABS 228 and setting the stripe height 226, other planarization techniques may be used to set the stripe height 226.

Figure 2B:
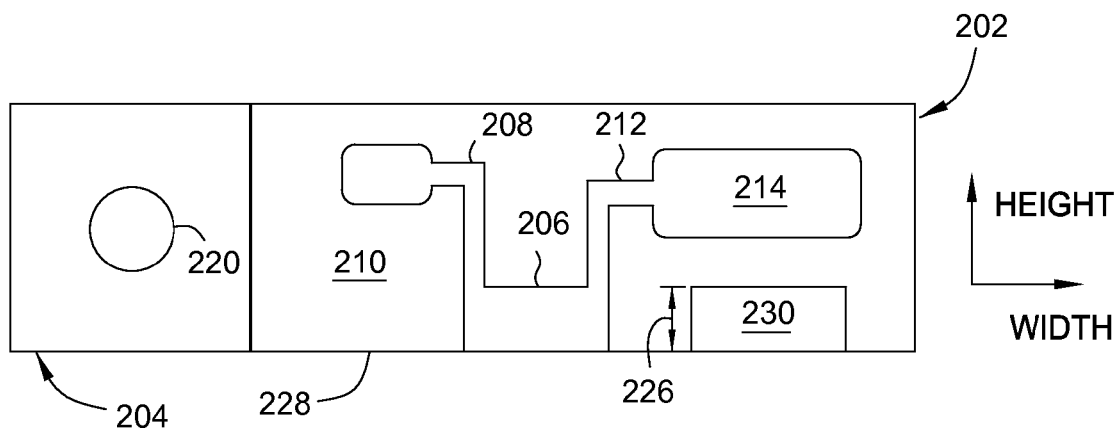
FIG. 2B is a bottom view of the slider according to one embodiment.

FIG. 2B is a bottom view of the slider 202 according to one embodiment. The bottom view shown in FIG. 2B corresponds to what eventually becomes the ABS 228 of the slider 202 and is the surface of the slider 202 which is lapped by a lapping device (not shown). Visible on the ABS 228 is the MR element 230 containing the read/write element and shields which will be polished to achieve the desired stripe height during the lapping process. Methods of lapping the ABS 228 of the slider 202 may include, for instance, a slurry process, a polishing plate using free abrasives such as alumina or diamond dust, or a polishing plate having an abrasive embedded in the plate. The lapping process may begin by performing a more coarse (rough) lapping step which removes a larger amount of material from the air bearing surface 228, followed by a fine lapping step, and in particular on the MR element 230 to achieve the desired stripe height 226. The ELG 206 can be formed proximate the ABS 228 to provide a measurement of the stripe height 226 as the lapping proceeds. The ELG 206 need not be formed in the slider 202 or other device region, so long as the ELG 206 is positioned proximate the ABS 228 of the row being lapped, such as an ELG 206 formed in the kerf region next to a slider 202.

The MR element 230 is shown proximal to ABS 228. The MR element 230 has a stripe height 226, which is greatly exaggerated relative to the total height of slider 202. Typically, the stripe height 226 of the MR element 230 is reduced to nominally 100 nm at rough lap and then to target in fine lap. The height of the slider 202 in one embodiment is approximately 0.23 millimeters. Thus, the height of the MR element 230 is roughly 100 times smaller than the height of the slider 202 at wafer level and 10,000× after lapping.

Figure 3A:
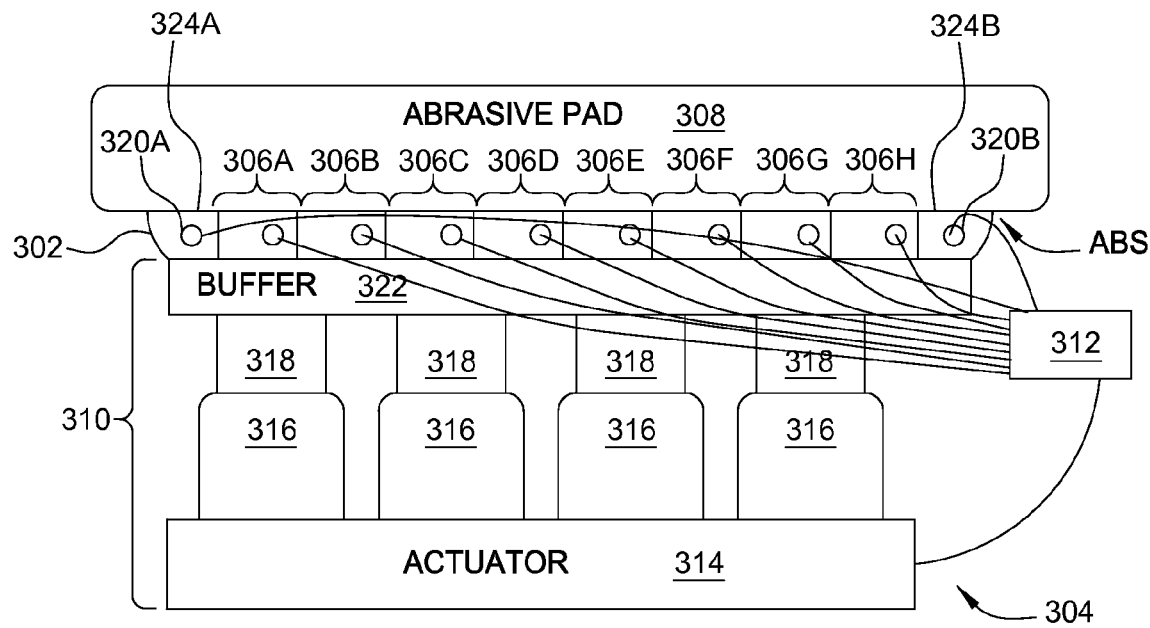
FIG. 3A illustrates lapping a row based on a measured resistance of one or more electronic lapping guides, according to embodiments described herein.

FIG. 3A illustrates lapping a row 302 based on a measured resistance of one or more ELGs, according to embodiments described herein. The row 302 diced from the wafer is mounted into the lapping system 304. As shown, the row 302 includes a plurality of sliders 306A-306H and row ends 324A and 324B. Only eight sliders are shown, but the number of sliders per each row may vary depending on the particular portion of the wafer the row was diced from. Accordingly, each row 302 may include only one slider or even a hundred sliders. Each slider 306A-306H includes an ELG, a bonding pad and a grounding via. The row ends 324A and 324B may have one or more peripheral grounding via 320A and 320B. The sliders 306 and the row ends 324 may incorporate any embodiment described herein.

The lapping system 304 also includes an abrasive pad 308, force system 310, and a lapping controller 312. The abrasive pad 308 may include one or more separate pads that rub against the ABS of the sliders 306A-306H, thereby removing portions of the ABS and reducing the height of the MR elements. The abrasive pad 308 may be an abrasive material such as diamond particles, aluminum oxide, or silicon carbide that grinds or laps away the portion of the sliders 306A-306H that the abrasive pad 308 contacts. Alternatively, the abrasive pad 308 may be a softer material such as tin that is "charged" with an abrasive to lap the ABS.

The force system 310 includes an actuator 314, pistons 316, rods 318, and a buffer 322. The actuator 314 is communicatively coupled to the lapping controller 312 and receives instructions for separately controlling the respective pistons 316. Stated differently, the actuator 314 uses the lapping controller 312 to determine how much force to apply to different portions of the row 302. The pistons 316 may be electrically, magnetically, pneumatically, or hydraulically controlled to apply a specified pressure or force to the buffer 322. The buffer 322—a semi-flexible material such as polyurethane—transfers the force to a respective portion of the row 302. By increasing the force applied by a particular piston 316, the actuator 314 controls the rate at which the abrasive pad 308 grinds a slider or group of sliders 306. Here, each piston 316 is associated with two sliders 306A-306H although each piston 316 may be assigned to more or less than this number. If the actuator 314 is informed by the lapping controller 312 that some subset of the sliders 306A-306H are being lapped at a different rate by the abrasive pad 308 relative to another portion, than the actuator 314 can adjust the associated pistons 316 to correct the imbalance.

The lapping controller 312 may be used to determine the lap rate of the different sliders 306A-306H and instruct the actuator 314 to correct any imbalance or stop the lapping process when the desired stripe height is achieved. As shown, the lapping controller 312 is electrically coupled (e.g., wire bonded) to the ELG of every slider in the row 302 using the bonding pads formed on the slider 306. However, the lapping controller 312 may be coupled to more or less than this. Further, though the lapping controller 312 may be connected to a bonding pad, the bonding pad may be used in an alternating fashion. For example, if a lapping controller is connected to 8 bonding pads for 8 sliders, a current may be actually delivered to only 3 bonding pads thus only measuring at 3 ELGs. The other ELGs may be activated thereafter to complete the measurement at each slider. In one embodiment, the lapping controller 312 is coupled to as many sliders as there are pistons 316 in the actuator 314. That is, the lapping system 304 may designate one of the sliders associated with a piston 316 as the representative head which is coupled to the lapping controller 312. The resistance of the ELG in the representative slider is then measured and used by the lapping controller 312 to control the associated piston 316. However, to improve control, in other embodiments the lapping controller 312 may be coupled to two or more of the sliders 306 associated with a single piston 316 and control the piston 316 based on measuring the resistance of both of the ELGs in the two or more heads. For example, the lapping controller 312 may average the measured resistances of the ELGs and use the average resistance to derive the stripe height and control the piston pressure.

The lapping controller 312 is electrically coupled to the row through at least one of the peripheral grounding vias 320A-320B. By connecting each ELG in a plurality of sliders 306 to the wafer, the lapping controller 312 no longer needs two connections to each slider 306. Instead, the lapping controller 312 uses only one connection to bonding pad on a slider 306 to access the ELG and a second connection to the wafer, thus reducing the number of electrical connections.

Figure 3B:
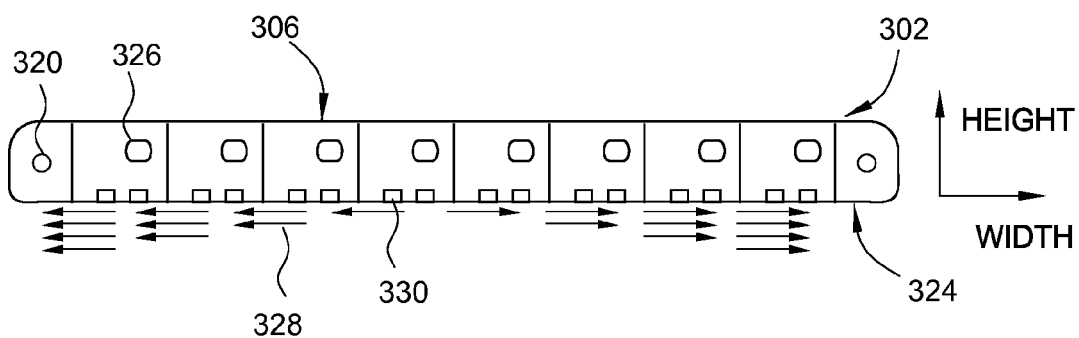
FIG. 3B is a depiction of a row containing multiple sliders for single pad lapping, according to one embodiment.

FIG. 3B is a depiction of a row 302 containing multiple sliders for single pad lapping, according to one embodiment. The row 302 can be connected to the lapping controller 312 at the bonding pad 326 of each slider 306 and the peripheral grounding vias 320 of the row ends 324. The lapping controller 312 applies a current to the ELG 330 through the bonding pad 326 using the row 302 as part of the electrical connection. The current flows through the row 302 to the peripheral grounding via and then back to the lapping controller. To measure a particular ELG resistance, the lapping controller knows the current it sources and divides it into the voltage across the ELG. However, the lapping controller cannot directly measure the ELG voltage because there is only 1 connection to the ELG. Instead it measures the voltage from the bonding pad side of the ELG to one of the grounding pads. It then must infer the voltage dropped across the row bar from information about the resistance of the row bar, the resistance of the vias from pads to row bar and the current distribution along the row bar. In this way, the lapping controller 312 can detect the resistance at a particular ELG 330 during the lapping process. Therefore, the accumulated current and the resistance of the wafer can affect the resistance detected at the ELG 330. The current created by the lapping controller 312 will preferentially move toward the closest peripheral grounding via 320, thus splitting the current between the two ends in this embodiment. Though oversimplifying for discussion, more current will move to a closer peripheral grounding via 320 and less current will move toward a more distant peripheral grounding via 320.

When measuring at all points on a row 302, the current at each ELG 330 will be delivered to the wafer through the first internal lead 208 and then split between the two peripheral grounding vias based on proximity. Arrows 328 depict the flow in both directions from each ELG 330. This depiction shows current accumulating at the vias, thus creating current crowding. Current crowding is the effect of current accumulating in the wafer or portions thereof, in this case the row 302, thus increasing the effective resistance of the ELG 330. Current crowding is cumulative with the resistance of the wafer itself.

Without intending to be bound by theory, the fewer grounding connections which the lapping controller forms with the wafer or the more sources of current provided to the wafer, the higher propensity of current crowding. Further, it is believed that the composition of the metal in the peripheral grounding via does not play a significant role in current crowding. Generally, high conductivity metals, such as gold, copper or nickel-iron, are used in the peripheral grounding vias. The composition of the wafer creates a resistivity that is approximately 50 times higher than the metal in the vias. Thus, when the wafer is used for grounding, the current that reaches the via is expected to be quickly dispersed in the high conductivity metal, whereas current can accumulate in the wafer itself. It is believed that current crowding can be controlled either by reducing current flow to the wafer, increasing current flow from the wafer or increasing the difference between the effective wafer resistance and the ELG resistance.

FIG. 4 depicts a slider with a more resistive ELG according to one embodiment. A slider 402 and a row end 404 are depicted here. The slider 402 includes an ELG 406 positioned proximate the air bearing surface with a decreased width 426. A first side of the ELG 406 is electrically connected to the wafer 410 through a first internal lead 408. A second internal lead 412 electrically connects a second side of the ELG 406 to a bonding pad 414. Both leads can have the same structure, composition and function as the leads described in FIG. 2A. The row end 404 may further comprise a peripheral grounding via 240.

A lapping controller (not shown) is electrically coupled to the ELG 406 by connecting a conductive wire 418 (e.g., gold or copper wire, or other highly conductive material) to a bonding pad 414. The connective material 416, as described with reference to FIG. 2A, may be used to physically and electrically couple the conductive wire 418 to the bonding pad 414. Like the bonding pad 414, the peripheral grounding via 420 may also be connected to the lapping controller using connective material 422 and a conductive wire 424.

The ELG 406 in this embodiment has a width 426 which has been reduced, as depicted by the upper and lower black bars. During operation, the lapping controller will create a current through the ELG 406 to detect the resistance of the ELG 406. Generally, the resistance of a material depends on its length, cross-sectional area, and the resistivity, among other factors. By reducing the cross sectional area of the ELG 406, we can increase its resistance. Other factors may also be manipulated so as to increase the resistance of the ELG 406. When the resistance of the ELG 406 is greater than 100 times the resistance of the effective wafer resistance, changes in the wafer resistance will be marginalized. When considering the resistance of the ELG 406 in comparison to the effective wafer resistance, the effective wafer resistance varies across the wafer 410 with the highest effective resistance near the peripheral grounding vias 420. Thus, the ELG 406 resistance should be compared to the effective wafer resistance near the peripheral grounding vias 420.

Further embodiments may achieve a similar marginalization of the effective wafer resistance with higher resistivity ELGs, such as an ELG with 50 times the resistance of the effective wafer resistance. Even greater comparative resistance in the ELG may be more beneficial to marginalizing the effective wafer resistance, such as an ELG with 100 times the resistance of the effective wafer resistance. Further, it is anticipated that by increasing the resistance of the ELG in combination with other techniques, such as using close approximations of the anticipated effective wafer resistance, one can achieve lapping within acceptable stripe height variance. For example, one embodiment may approximate the effective wafer resistance and compensate for it at each ELG while simultaneously employing an ELG with a resistance that is 25 times that of the effective wafer resistance. By marginalizing the effective wafer resistance, one can achieve acceptable stripe height variance using single pad lapping. It is important to note that changing the cross sectional area of the ELG is not the only method for increasing resistance of the ELG. For example, further embodiments may include changing the composition of the ELG so as to increase the resistance without changing the size of the ELG or combinations of composition and size changes.

Figure 5:
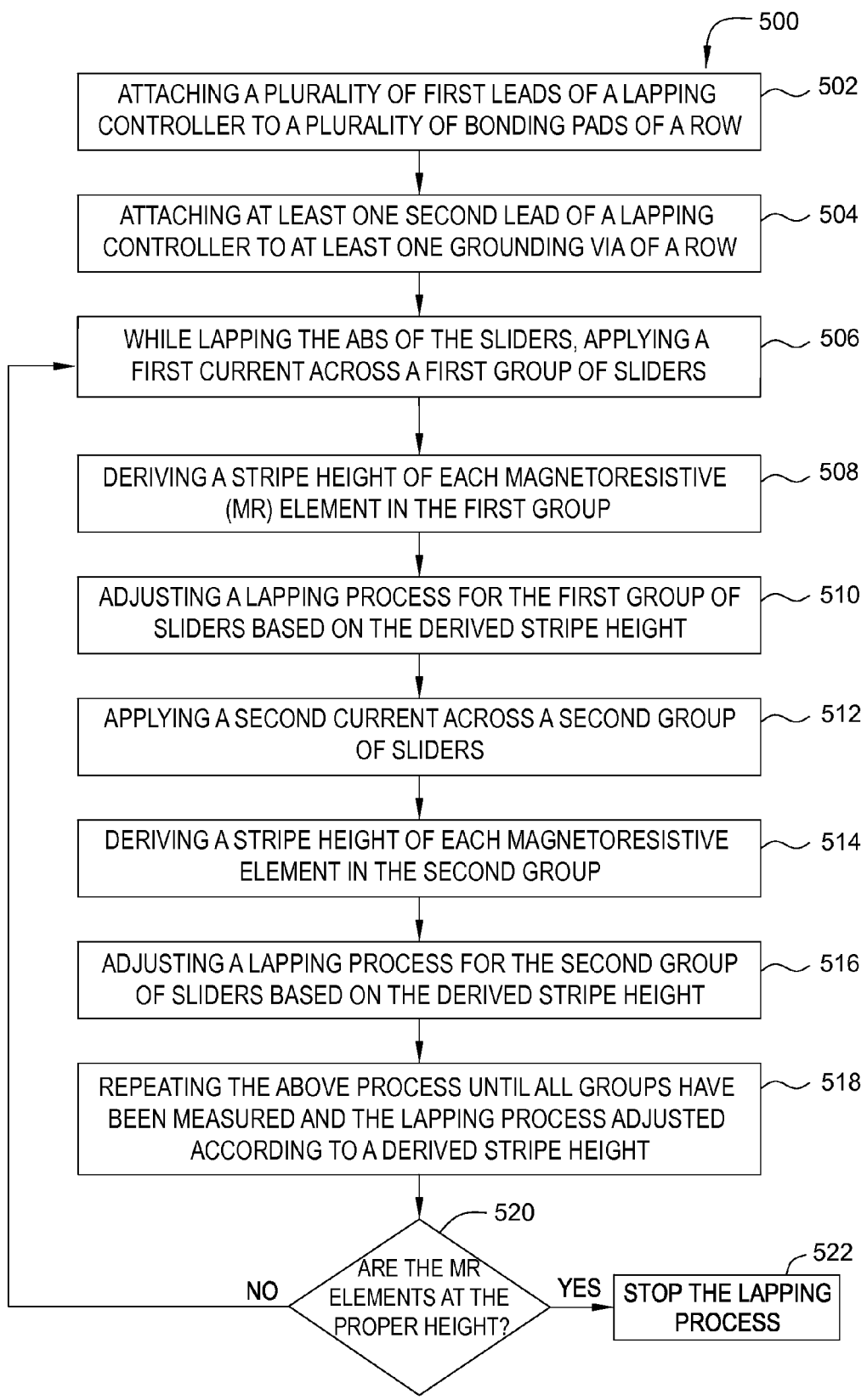
FIG. 5 depicts a method of multiplex measuring of the wafer during single pad lapping according to one embodiment.

FIG. 5 depicts a method 500 of multiplex measuring of the wafer during single pad lapping according to one embodiment. In this embodiment, the number of currents used to detect the resistance of the ELG is reduced thus reducing or preventing the accumulation of current in the wafer. The method 500 can include attaching a plurality of first leads of a lapping controller to a plurality of bonding pads of a wafer, as in 502. Specifically, the bonding pad is electrically coupled to an ELG placed in proximity of the ABS. In one embodiment, the lead from the lapping controller is attached by wire bonding a conductive wire to the bonding pad. Alternatively, the lapping controller may be coupled using a soldering technique, conductive paste, ultrasonic bonding, and the like. Moreover, attaching the lead to the pad may be performed by either a technician or by a wire bonding apparatus.

The method 500 can further include attaching at least one second lead of lapping controller to at least one grounding via of a wafer, as in 504. In this embodiment, the available ELGs are electrically connected to the shared wafer which acts as a common ground for the ELGs. The lapping controller is attached to the peripheral grounding via that is also electrically coupled to the shared wafer on which the sliders are disposed. Once all connections are made and the wafer is properly positioned in the lapping system, the lapping process can begin, as described with reference to FIG. 3B.

The method 500 can further include applying a first current across a first group of sliders during the lapping process, as in 506. In this embodiment, the lapping controller applies constant currents across the first group of sliders between the bonding pads through the ELG and the wafer to the common grounding vias of the wafer. Voltage will vary as the current meets resistance in the wafer and the ELG. This voltage variance is detected and used to determine the resistance between a particular bonding pad and the common grounding via. In some embodiments, lapping continues during the measurement of resistance in the ELG, which can be determined in 50 msec or less. However, in other embodiments, the lapping process may be paused while the lapping controller measures the current resulting from the applied voltage.

The first group of sliders can be a sequential group of sliders or a randomly selected group of sliders, in one or more embodiments. For example, a sequential group of sliders might be sliders 1-8 in a wafer of 60 sliders. Further groups in this embodiment would be composed of sliders 9-60. Further embodiments can include alternative selection of sliders, such as every other slider in the wafer up to the maximum for a group. As well, sliders for a group might be selected at random from the wafer. The maximum for the group should be selected so as to minimize the accumulation of current in the slider while simultaneously maximizing throughput for the lapping process. In some embodiments, this might be less than or equal to 20% of the total sliders available, such as 12 sliders on a wafer with a total of 60 sliders. In further embodiments, this might be less than or equal to 15% of the total sliders available.

The method 500 can further include deriving a stripe height of each MR element in the first group, as in 508. In this embodiment, the lapping controller derives the resistance of the ELG based on the total resistance determined by measuring the voltage at a constant current. As described above, the effective wafer resistance can affect the detected resistance at the ELG. However, by reducing the number of ELG which receive current from the lapping controller at one time, the effective wafer resistance can be minimized so that the only additional resistance is the resistance inherent to the wafer. This resistance can be reasonably accommodated for since current is not accumulating or are accumulating minimally. Once the stripe height is determined for a particular group, current from the lapping controller is stopped.

The method 500 can further include adjusting the lapping of the wafer for the first group of sliders, based on the derived stripe height, as in 510. As described previously, lapping can be controlled so that a ABS of a specific MR element on a slider is lapped independent of the other MR elements on other sliders. Using the derived stripe height, the lapping controller can send a signal to the lapping system to adjust the lapping of each slider of the group based on the measured stripe height at the ELG. In this way, a group from a single pad lapped slider can be lapped to an appropriate stripe height while avoiding the effects of current accumulation.

The method 500 can further include applying a second current across a second group of sliders, as in 512. In this embodiment, the lapping controller may switch from applying a current to the first group to applying a current to the second group through the previously attached first leads. Notably, even when switching between different read heads, the lapping controller continues to use the same ground connection to induce a current in the respective ELG.

The method 500 can further include deriving a stripe height of each MR element in the second group, as in 514. In this embodiment, the lapping controller may use the same techniques discussed group of sliders based on the measured resistance of the ELGs in the second group. Further, the selection of the sliders which are measured in the second group can be any one of the embodiments described above. The group selection scheme does not necessarily match the group selection scheme used previously, so long as the group members do not overlap until all sliders have been measured and adjusted based on stripe height.

The method 500 can further include adjusting the lapping process for the second group of sliders based on the derived stripe height, as in 516. The adjustment to the lapping process shown here can be substantially similar to the adjustment described in 510.

The method 500 can further include repeating the above process until all groups have been measured and the lapping process has been adjusted according to the derived stripe height, as in 518. A standard row will have multiple groups based on the number of sliders available. The above described groups of no more than 15% or 20% of the available sliders would require 5 or more groups to be formed. It is important that lapping be compensated for at 100% of the MR elements of the sliders. However, this does not necessarily require that 100% of the ELGs be detected at and adjusted for. In one embodiment, 100% of the ELGs are connected to the lapping controller and detected according to the above described embodiments. In another embodiment, one ELG is detected per associated piston in the lapping system, which could mean that less than 100% of the ELGs are connected to the lapping controller and detected as described in the above embodiments. For example, 50% of the ELGs could be connected and detected as described in the above embodiments, when one piston is associated to every two ELG.

The method can further include repeating the entire process based on whether the MR elements are at the appropriate height, as in 520. If the MR elements are at the appropriate height, as determined at the ELG, the lapping process is terminated, as in 522. However, if the MR elements are not at the appropriate stripe height, the lapping process can begin again at step 506. The grouping of sliders which was previously selected can remain the same or it can be altered. Thus the first group from the first lapping process may include the originally selected members, different members entirely or some combination of the same and different members. All groups as designated would then repeat the application of current, derivation of stripe height and adjustment of lapping based on the derived stripe height until all MR elements on all sliders on the wafer are determined to be at an appropriate stripe height.

Figure 6:
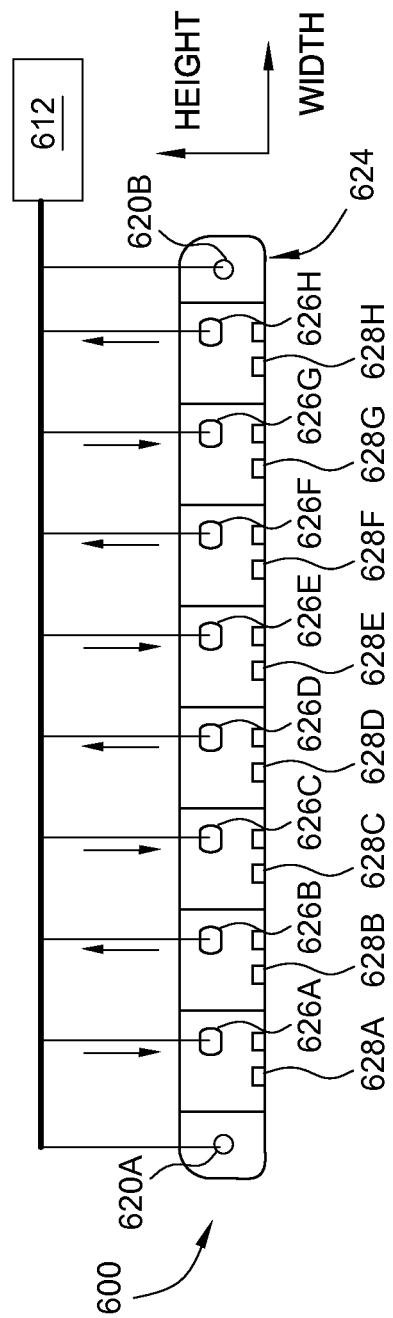
FIG. 6 is a cross sectional view of a row of sliders connected with an alternating current lapping controller according to one embodiment.

FIG. 6 is a cross sectional view of a row of sliders connected with an alternating current lapping controller 612 according to one embodiment. Depicted here is a wafer 600 connected with alternating current lapping controller 612. The wafer 600 can be connected to the lapping controller 612 at the bonding pad 626A-626H of the sliders and the peripheral grounding vias 620A and 620B of the row ends 624. The alternating current lapping controller 612 applies a current to the ELG 628A, 628C, 628E and 628G through bonding pads 626A, 626C, 626E and 626G using the wafer 600 as part of the electrical connection. The current delivered through bonding pads 626A, 626C, 626E and 626G splits in two directions and is received at bonding pads 626B, 626D, 626F and 626H as well as the peripheral grounding vias 620A and 620B. Using the current received by bonding pads 626B, 626D, 626F and 626H, the resistance of the ELG 628B, 628D, 628F and 628H is determined based on the flow of current into the lapping controller 612. In this way, current delivered to the wafer 600 is used to determine resistance upon entrance at ELGs 628A, 628C, 628E and 628G and upon exit at ELG 628B, 628D, 628F and 628H.

Unlike use of a common grounding via 620A and 620B alone, current crowding in the wafer 600 does not occur in the alternating current detection system. Since the wafer 600 is part of the circuit and each ELG 628 is connected to the wafer 600, the current that flows into the wafer 600 is flowing out of the wafer 600 at a similar rate. As the lapping controller 612 by this design is detecting the resistance of the ELGs 628 in an alternating fashion, current does not accumulate in the wafer 600. The detected resistance at ELG 628B, 628D, 628F and 628H will not include resistance from the wafer 600. The detected resistance at ELGs 628A, 628C, 628E and 628G will include resistance from the wafer only, without current crowding. Therefore, the resistance at the wafer 600 for ELGs 628A, 628C, 628E and 628G is expected to be around 0.04 Ohms for an AlTiC wafer.

Further embodiments of controlling for the effects of effective wafer resistance can include software which compensates for the effective resistance of the wafer. The software can control the hardware so as to negate the effective resistance of the wafer and only adjust the lapping system for the resistance in the ELG itself. This software would include establishing a linear circuit equivalent of all ELGs on the wafer, such as 60 ELGs, the potential current sources and grounding for the linear circuit. Software in this embodiment, would have a known offset for each ELG based on the inverse of the linear system matrix at each ELG and the number of ELGs actually connected. The offset would then be deducted from the detected resistance at the ELG to produce a derived resistance. The derived resistance would then be used to determine the stripe height of the ELG and subsequently the stripe height of the MR element.

Though the embodiments above focus on specific adjustments to either marginalize the effect of, compensate for, or to prevent changes in the effective wafer resistance, it is envisioned that any one of these embodiments can be used together so as to achieve the same effect. For example, the resistance at the ELG could be altered while simultaneously multiplexing the measurement as described above.

CONCLUSION

Embodiments described herein generally relate to marginalization of or compensation for the effective wafer resistance in single pad lapping. During a lapping process, the electrical resistance of the ELG is used to adjust the lapping and set the stripe height for a MR element on a slider. Specifically, as an exterior surface of the ELG at the ABS is lapped, the resistance of the ELG increases. Once the resistance corresponds to the desired stripe height—i.e., the distance between the ABS and the back edge of the MR element—the lapping process is stopped.

Because many slider fabrication techniques lap a plurality of sliders simultaneously, one or more of the ELG in the regions proximate the slider may be electrically coupled to the wafer. The lapping controller is then wire bonded to the individual ELGs via bonding pads, but the controller is connected to the wafer only at a few locations. For example, the lapping controller may be wire bonded to four ELGs in a row of read heads but only have one or two electrical connections to the conductive wafer. Minimizing the number of wire bonds by using a common ground (e.g., the conductive wafer) may provide cost savings compared to wire bonding the lapping controller to two bonding pads per slider. However, due to the reduced connections and the use of a common ground to the wafer, resistance from the wafer itself can prevent proper lapping of the MR element.

In one embodiment, the effective resistance can be compensated for by employing a calculated constant based on standard embodiments of the wafer with sliders, MR heads and ELGs formed thereon. This correction can be dynamic based on both known factors and prior testing, thus preventing the deleterious effects of existing current crowding in the wafer during lapping. In a further embodiment, the determination of the resistance at the ELGs can be performed in a sequenced fashion to prevent the accumulation of current. Thus, current crowding effect will be negligible on the overall lapping process at a cost of speed. In another embodiment, the lapping controller can detect the resistance of the ELG in an alternating fashion. By alternating the delivery and receipt of current so as to detect the resistance of each ELG, ELGs can be measured simultaneously, with little or no current accumulation in the wafer while maintaining the accuracy of the lapping process similar to a double pad lapping process. In a further embodiment, the ELG resistance can be designed to be much larger than that of the effective wafer resistance. The resistance of the ELG can be altered in a number of ways, include changing the composition of the ELG and changing the cross-sectional dimensions of the ELG. By employing an ELG with a resistance much higher than that of the wafer, the errors caused by effective wafer resistance can be minimized while performing a full wafer or a full row lapping.

While the foregoing is directed to embodiments of the present invention, other and further embodiments of the invention may be devised without departing from the basic scope thereof, and the scope thereof is determined by the claims that follow.

What is claimed is:

1. A device, comprising:
a row of sliders, each slider comprising:
a magnetoresistive (MR) element deposited at an air bearing surface (ABS) of the slider;
an electronic lapping guide (ELG) positioned at the ABS and electrically connected to a wafer, the ELG comprising a resistance and the wafer comprising an effective wafer resistance, wherein the resistance of the ELG is at least 50 times greater than the effective wafer resistance; and
a bonding pad electrically connected to the ELG;
end regions formed at one or more ends of the row; and
at least two peripheral grounding vias, the vias being formed in the end regions and comprising a conductive material formed therein.

2. The device of claim 1, wherein the resistance of the ELG is at least 100 times greater than the effective wafer resistance.

3. The device of claim 1, wherein the ELG has a track width of between 20 um and 30 um.

4. The device of claim 1, further comprising a lapping controller, wherein the lapping controller is an alternating current lapping controller.

5. The device of claim 1, wherein the ELG has a cross-sectional area and wherein the cross sectional area of the ELG is decreased to increase the resistance of the ELG.

6. A method, comprising:
positioning a wafer in a lapping system with a lapping controller, the wafer comprising:
a plurality of sliders;
a magnetoresistive (MR) element deposited at an air bearing surface (ABS) of each slider;
one or more electronic lapping guides (ELGs) positioned at the ABS and electrically connected to the wafer, wherein the ELGs correspond to at least one of the plurality of sliders;
a bonding pad electrically connected to each of the one or more ELGs; and
one or more peripheral grounding vias electrically connected to the wafer;
connecting the lapping controller with the wafer at the bonding pad and the peripheral grounding vias;
delivering a current to at least one of the ELGs through the bonding pad, wherein no more than 20% of the one or more ELGs in the wafer receive a current at one time, and wherein the bonding pads and the peripheral grounding vias are electrically connected through the wafer;
detecting a resistance at the ELGs which receive a current;
adjusting lapping based on the resistance detected at the ELGs which receive a current, wherein the lapping is adjusted based on the resistance of the corresponding ELGs;
lapping the ELGs based on the resistance detected to achieve a specific stripe height; and
repeating the steps of delivering the current, detecting the resistance, adjusting the lapping and lapping the ELGs until each of the ELGs is lapped to a specific stripe height.

7. The method of claim 6, wherein the current is delivered to no more than 15% of the ELGs at one time.

8. The method of claim 6, further comprising separating the sliders into at least 7 groups of sliders and the sliders only belong to one group at a time.

9. The method of claim 8, wherein the groups of sliders are positioned in a line proximate to one another.

10. The method of claim 8, wherein the groups of sliders are selected randomly from the sliders on the wafer.

11. The method of claim 8, further comprising lapping each group of sliders more than once.

12. The method of 8, wherein the groups of sliders are reselected on subsequent lappings.

13. The method of claim 6, wherein one of the ELGs is used to adjust the lapping for more than one slider.

14. The method of claim 6, wherein delivering the current further comprises sequentially alternating the directionality of current delivered to the ELGs.

15. A system for lapping a wafer, the wafer comprising:
a plurality of sliders, each slider comprising:
a magnetoresistive (MR) element deposited at an air bearing surface (ABS) of the slider;
an electronic lapping guide (ELG) positioned at the ABS and electrically connected to the wafer; and a bonding pad electrically connected to the ELG, wherein the wafer has one or more peripheral grounding vias formed therein; and the system comprising:

a lapping system comprising a lapping controller and configured to simultaneously lap an air bearing surface on the plurality of sliders, wherein the wafer is configured to be mounted on the lapping system; and the lapping controller electrically coupled to the bonding pads and the peripheral grounding vias, the lapping controller configured to sequentially provide a current to the ELGs in groups of no more than 20% of the attached ELGs, measure the resistance of the ELGs using the current path, and provide instructions to the lapping system based on the measured resistance, wherein the lapping controller is also configured to provide current, measure resistance and provide instructions to the lapping system until each slider is lapped by the lapping system to a desired stripe height.

16. The system of claim 15, wherein the lapping controller delivers the current to no more than 15% of the ELGs at one time.

17. The system of claim 15, wherein the lapping controller is configured to separate the sliders into at least 7 groups of sliders, wherein the sliders only belong to one group at a time.

18. The system of claim 17, wherein the lapping controller is configured to select the groups of sliders in a line proximate to one another.

19. The system of claim 17, wherein the lapping controller configured to select groups of sliders randomly.

20. The system of claim 17, further comprising the lapping system configured to lap each group more than once.

21. The system of claim 17, wherein the lapping controller is configured to reselect groups of sliders on subsequent lappings.

22. The system of claim 15, wherein the lapping controller is configured to adjust lapping for more than one slider based on measurement at one of the ELGs.

* * * * *

UNITED STATES PATENT AND TRADEMARK OFFICE
CERTIFICATE OF CORRECTION

PATENT NO. : 8,956,201 B2  Page 1 of 1
APPLICATION NO. : 13/690694
DATED : February 17, 2015
INVENTOR(S) : Druist et al.

It is certified that error appears in the above-identified patent and that said Letters Patent is hereby corrected as shown below:

In the Specification

Column 3, Line 61, please delete "(AlTiC)" and insert --(AlTiC)-- therefor;

Column 5, Line 52, please delete "(AlTiC)" and insert --(AlTiC)-- therefor;

Column 12, Line 34, please delete "AlTiC" and insert --AlTiC-- therefor.

Signed and Sealed this
Thirtieth Day of June, 2015

Michelle K. Lee
*Director of the United States Patent and Trademark Office*